US009837169B2

(12) United States Patent
Diokno et al.

(10) Patent No.: US 9,837,169 B2
(45) Date of Patent: Dec. 5, 2017

(54) MEMORY SYSTEM FOR RAPIDLY TESTING DATA LANE INTEGRITY

(71) Applicant: Lenovo Enterprise Solutions (Singapore) Pte. Ltd., Singapore (SG)

(72) Inventors: Robert Diokno, Raleigh, NC (US); Paul D. Kangas, Raleigh, NC (US); Matthew Weber, Wake Forest, NC (US); Timothy M. Wiwel, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/052,366

(22) Filed: Feb. 24, 2016

(65) Prior Publication Data

US 2017/0243661 A1    Aug. 24, 2017

(51) Int. Cl.
*G11C 29/44* (2006.01)
*G01R 31/02* (2006.01)
*G11C 29/12* (2006.01)
*G11C 29/02* (2006.01)

(52) U.S. Cl.
CPC .......... *G11C 29/1201* (2013.01); *G01R 31/02* (2013.01); *G01R 31/024* (2013.01); *G11C 29/022* (2013.01); *G11C 29/44* (2013.01)

(58) Field of Classification Search
CPC .... G11C 29/1201; G11C 29/44; G01R 31/02; G01R 31/024
USPC ............................................... 365/201, 233.1
See application file for complete search history.

(56) References Cited

U.S. PATENT DOCUMENTS

| | | | | |
|---|---|---|---|---|
| 6,347,367 | B1* | 2/2002 | Dell | G06F 13/4239 326/30 |
| 7,679,396 | B1* | 3/2010 | Kao | H03K 19/01857 326/27 |
| 2002/0089335 | A1* | 7/2002 | Williams | G01R 31/11 324/533 |
| 2006/0041730 | A1* | 2/2006 | Larson | G06F 13/4243 711/167 |
| 2008/0291747 | A1* | 11/2008 | Goodwin | G11C 5/04 365/189.05 |
| 2011/0304340 | A1* | 12/2011 | Hall | H04M 3/306 324/533 |
| 2013/0182511 | A1 | 7/2013 | Mutnury et al. | |
| 2014/0122966 | A1 | 5/2014 | Berke et al. | |
| 2015/0186328 | A1* | 7/2015 | Bonen | G11C 29/028 710/105 |

* cited by examiner

*Primary Examiner* — Hoai V Ho
*Assistant Examiner* — Jay Radke
(74) *Attorney, Agent, or Firm* — Jeffrey L. Streets

(57) ABSTRACT

A memory system for a computer is provided as well as a method for integrity testing a memory interface. The memory system includes a memory controller providing a memory interface including a plurality of data lanes, wherein each of the plurality of data lanes includes a driver and a receiver, and wherein each receiver has an output. The memory system further includes an AND gate having an output and a plurality of inputs, wherein the output of each receiver is coupled to one of the plurality of inputs of the AND gate. The method includes driving a high signal pulse onto each of a plurality of data lanes of a memory interface, receiving a reflection of the high signal pulse on each of the data lanes, and determining whether the reflections received on the data lanes indicate that any one or more of the data lanes is defective.

18 Claims, 5 Drawing Sheets

MEMORY SYSTEM FOR RAPIDLY TESTING DATA LANE INTEGRITY

BACKGROUND

Field of the Invention

The present invention relates to memory systems having a memory controller in communication with a plurality of memory modules.

Background of the Related Art

A fundamental hardware component of a computer is the memory that is used to store information for high speed access by a central processing unit. The memory is typically an addressable volatile or non-volatile integrated circuit. One example of a memory device is a dual in-line memory module (DIMM) supporting a series of dynamic random-access memory chips and having an edge connector that is received into a slot on a motherboard.

The central processing unit communicates with the memory through a memory controller. The memory controller establishes a memory interface or memory bus that includes a number of parallel data lanes extending between the memory controller and each of the memory modules. In some instances, the memory interface may include 64 data lanes in order to transfer 64 bits of data at a time. The number of data lanes, as well as the memory bus clock rate and whether the interface uses single data rate (SDR) or double data rate (DDR), contributes to the bandwidth of the memory interface.

With today's high speed memory interfaces, the memory controller must train each data channel for each DIMM in a system. This training process optimizes the performance of the data lanes, but takes most of the time in a system boot. In some cases, the DIMM training process gets fairly far along before a bad data lane is detected.

BRIEF SUMMARY

One embodiment of the present invention provides a memory system for a computer. The memory system comprises a memory controller providing a memory interface including a plurality of data lanes, wherein each of the plurality of data lanes includes a driver and a receiver, and wherein each receiver has an output. The memory system further comprises an AND gate having an output and a plurality of inputs, wherein the output of each receiver is coupled to one of the plurality of inputs of the AND gate.

Another embodiment of the present invention provides a method, comprising driving a high signal pulse onto each of a plurality of data lanes of a memory interface, receiving a reflection of the high signal pulse on each of the data lanes, and determining whether the reflections received on the data lanes indicate that any one or more of the data lanes is defective.

DETAILED DESCRIPTION

Figure 1:
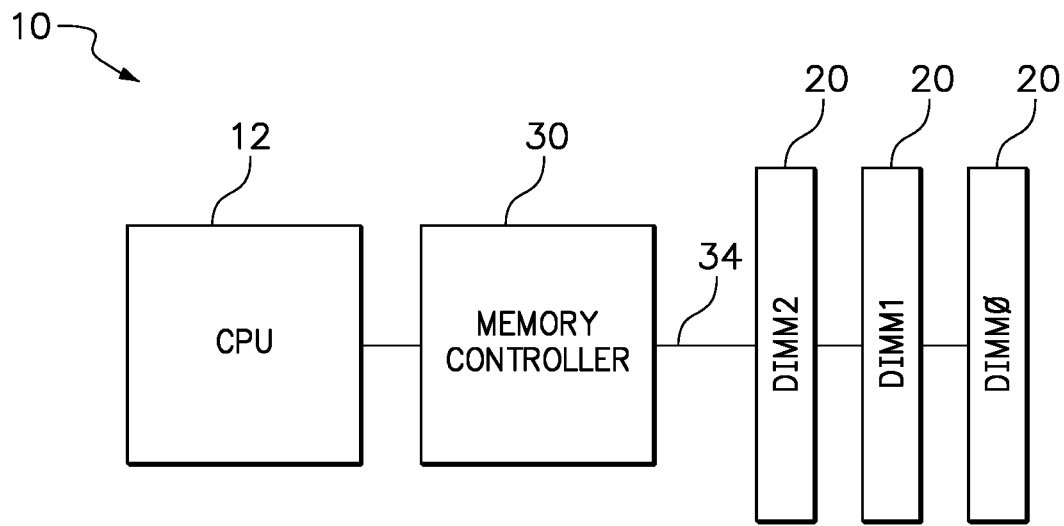
FIG. 1 is a diagram of a central processing unit in communication with memory devices via a memory interface provided by a memory controller.

One embodiment of the present invention provides a memory system for a computer. The memory system comprises a memory controller providing a memory interface including a plurality of data lanes, wherein each of the plurality of data lanes includes a driver and a receiver, and wherein each receiver has an output. The memory system further comprises an AND gate having an output and a plurality of inputs, wherein the output of each receiver is coupled to one of the plurality of inputs of the AND gate. In various embodiments, the memory system may further comprise a plurality of memory modules, wherein each memory module is coupled to the plurality of data lanes. Non-limiting examples of the memory modules include dual in-line memory modules (DIMM).

In a preferred option, the output of the AND gate provides either a positive (high) signal indicating that none of the data lanes of the memory interface is defective or a negative (low) signal indicating that one or more of the data lanes of the memory interface is defective. Where each of the data lanes are bidirectional and matched in length, simultaneously driving a high signal pulse onto each of the plurality of data lanes will cause the reflections on each of the plurality of data lanes to arrive at the receiver at the same time except for any data lane that is defective.

In a further embodiment of the memory system, the memory controller may provide a second memory interface including a second plurality of data lanes, wherein each of the second plurality of data lanes includes a driver and a receiver. Such embodiment may further comprise a second AND gate having an output and a plurality of inputs, wherein the output of each receiver in the second plurality of data lanes is coupled to one of the plurality of inputs of the second AND gate. Accordingly, the memory system may include multiple memory interfaces, where each memory interface is adapted for independently testing the integrity of the data lanes of the memory interface. Optionally, the output of the second AND gate provides either a positive signal indicating that none of the data lanes of the second memory interface is defective or a negative signal indicating that one or more of the data lanes of the second memory interface is defective.

Another embodiment of the present invention provides a method, comprising driving a high signal pulse onto each of a plurality of data lanes of a memory interface, receiving a reflection of the high signal pulse on each of the data lanes, and determining whether the reflections received on the data lanes indicate that any one or more of the data lanes is defective. For example, where each of the data lanes are bidirectional and matched in length, and where the high signal pulse is simultaneously driven onto each of the plurality of data lanes, it may be determined that none of the data lanes is defective in response to receiving the reflections at the same time. Alternatively, it may be determined that one or more of the data lanes is defective in response to receiving at least one of the reflections at a different time than the other reflections. In a further option, the method may, in response to determining that one or more of the data lanes is defective, include identifying the one or more of the data lanes that is defective.

Each of the data lanes may include a driver and a receiver, wherein each driver has an output that drives the high signal pulse onto a corresponding data lane and each receiver has an input that receives the reflection of the high signal pulse on the corresponding data lane. The logical AND gate preferably has inputs receiving an output from each receiver and an output sending a signal that indicates whether any one or more of the data lanes is defective.

In various embodiments of the memory system, each driver of the memory interface may have an enable input coupled to a single driver enable signal line of the memory interface. Similarly, each receiver of the memory interface may have an enable input coupled to a single receiver enable signal line of the memory interface. In such embodiments, the driver may generate the high signal pulse by applying a high signal to an input of the driver and then using the enable input to the driver to enable and disable the driver while the high signal is being input to the driver. Accordingly, the driver will output a high signal pulse during the brief period that the driver is enabled, which may be a single clock cycle. Still further, the method may, after the driver has generated the high signal pulse, enable the receiver to receive the reflection.

The methods of the present invention may further include training each of the data lanes in response to determining that none of the data lanes are defective. Where it has been determined that none of the data lanes are defective, the training process prepares the memory interface for use. However, the method may also include preventing the training of any of the data lanes in response to determining that one or more of the data lanes are defective. Where at least one of the data lanes is determined to be defective, attempting to train the data lanes is not beneficial and simply consumes time and energy. One benefit of various embodiments of the present invention is the ability to reduce the amount of time it takes to find a defective interconnect between the memory DIMM and the memory controller.

FIG. 1 is a diagram of a computer 10 including a central processing unit (CPU) 12 in communication with memory modules 20 via a memory interface 34 provided by a memory controller 30. The memory interface 34 includes a plurality of data lanes (not shown) that extend from the memory controller 30 to each of the three memory modules 20 (DIMM0, DIMM1 and DIMM2). The number of data lanes in a memory interface may vary among computers, but a double data rate synchronous dynamic random-access memory (DDR SDRAM) interface may be 64 lanes (bits) wide.

Figure 2:
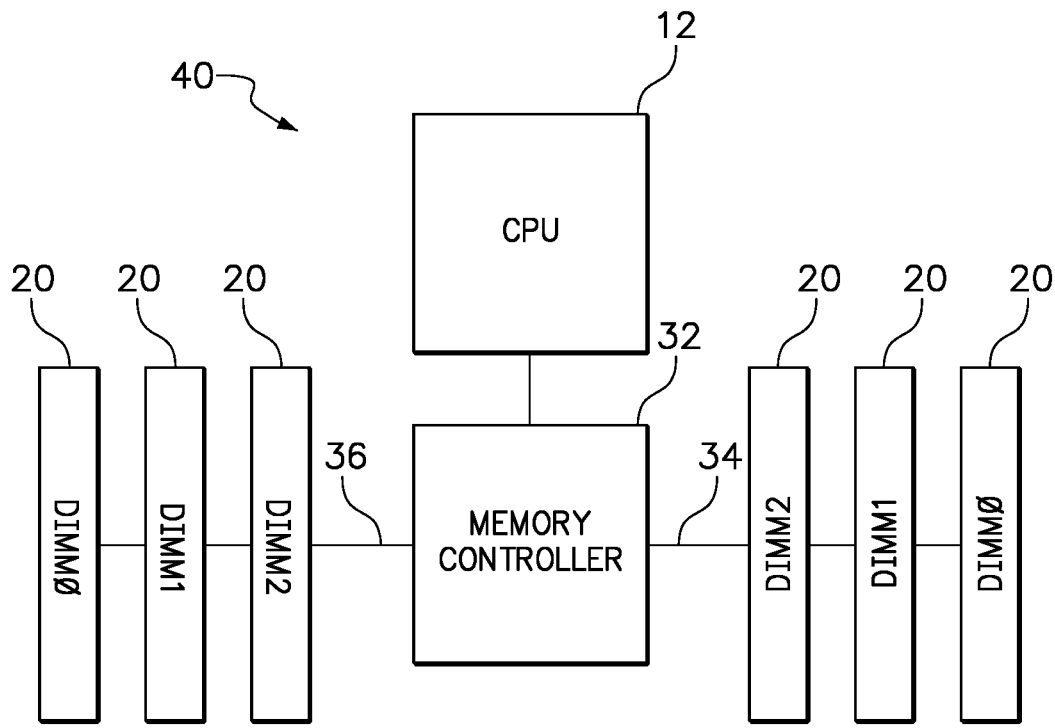
FIG. 2 is a diagram of a central processing unit in communication with memory devices via two memory interfaces provided by a memory controller.

FIG. 2 is a diagram of a computer 40 including a central processing unit (CPU) 12 in communication with memory modules 20 via two memory interfaces 34, 36 provided by a memory controller 32. Each memory interface 34, 36 includes a plurality of data lanes (not shown) that extend from the memory controller 32 to each of the memory modules 20 on the respective memory interface 34, 36.

Figure 3:
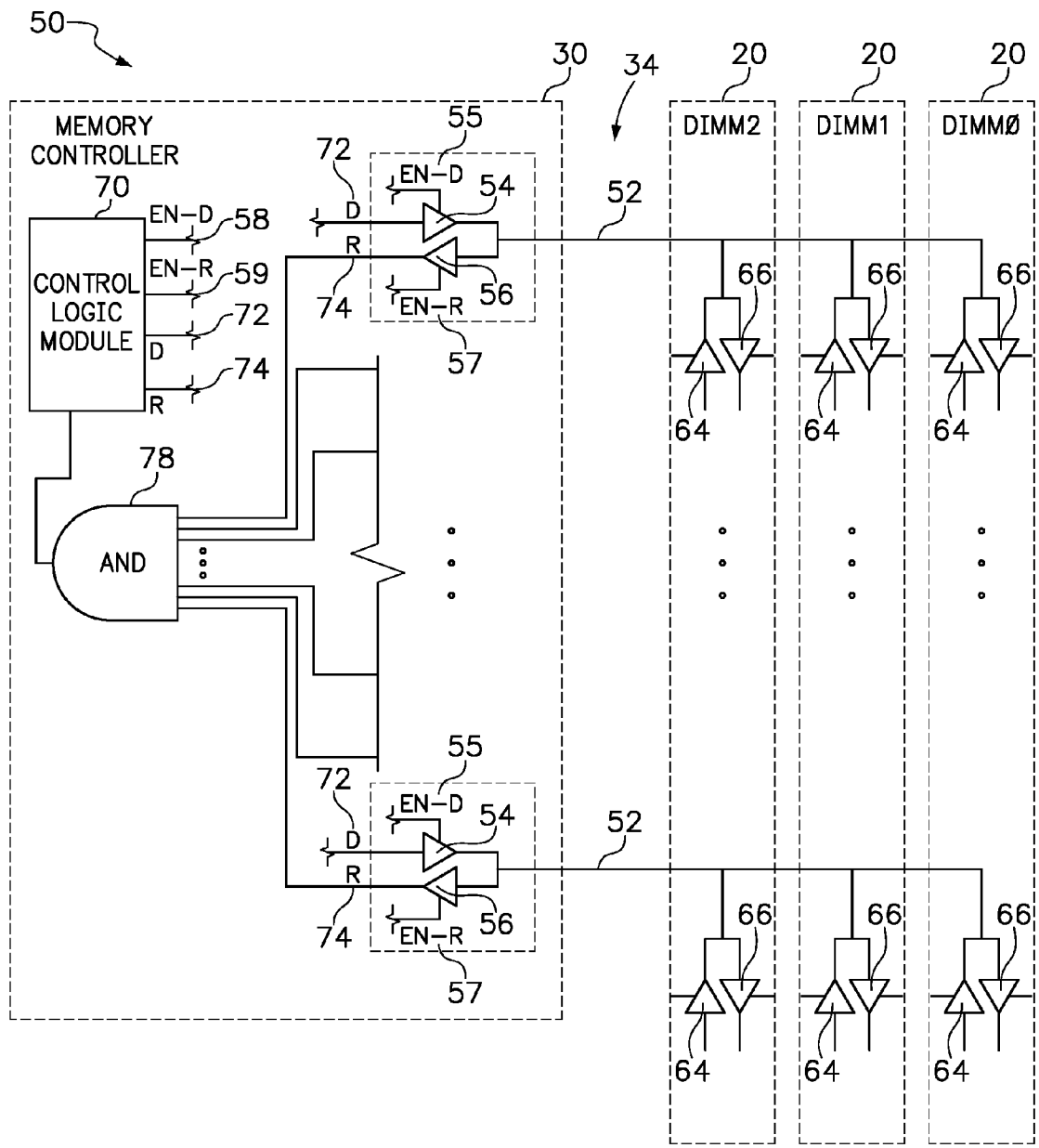
FIG. 3 is a diagram of a memory system according one embodiment of the present invention.

FIG. 3 is a diagram of a memory system 50 according one embodiment of the present invention, which may be incorporated into a computer, such as the computer 10 of FIG. 1 or the computer 40 of FIG. 2. For simplicity, the memory system 50 of FIG. 3 is shown having a single memory interface 34 that is representative of embodiments of the present invention, but it should be recognized that systems having two or more memory interfaces would have similar construction and operation to the system shown.

The memory interface 34 has a plurality of data lanes 52 (only two shown), such as 64 data lanes, providing communication between the memory controller 30 and each of the memory modules 20 (DIMM0, DIMM1 and DIMM2). Conventional components of the memory controller 30 and the memory modules 20 are not shown in order to direct attention to those components that are involved in integrity testing of the plurality of data lanes 52 of the memory interface 34.

Each data lane 52 (only two shown) includes a driver 54 and a receiver 56 (i.e., a "driver/receiver pair") at the memory controller 30 and a driver 64 and a receiver 66 (i.e., a "driver/receiver pair") at each DIMM 20. The memory controller 30 includes a control logic module 70 that is in communication with the driver 54 via an output line 72 and in communication with the receiver 56 via an input line 74. While not shown, the control logic module 70 will have an output line to the driver 54 of each data lane of the memory interface 34 and an input line from the receiver 56 of each data lane of the memory interface 34. Accordingly, the control logic module 70 may send data to the memory modules 20 using the output lines 72 and the drivers 54 and receive data from the memory modules 20 using the receivers 56 and the input lines 74.

Each driver 54 of the memory interface 34 may also have an enable input 55 ("EN-D") coupled to a driver enable signal line 58, and each receiver 56 of the memory interface 34 may also have an enable input 57 ("EN-R") coupled to a receiver enable signal line 59. The driver enable signal line 58 and the receiver enable signal line 59 are controlled by the control logic module 70, which may be a processor executing program instructions for performing embodiments of the present invention. In one embodiment, a single driver enable signal line 58 is used to simultaneously enable each of the drivers 54 in order to send data on each data lane 52 and a single receiver enable signal line 59 is used to simultaneously enable each of the receivers 56 in order to receive data on each data lane 52. Each driver of the memory controller is enabled when the memory controller transmits data to a selected DIMM and is disabled when the memory controller is ready to receive data from the selected DIMM. Conversely, each receiver of the memory controller is enabled when the memory controller is ready to receive data from a selected DIMM and is disabled when the memory controller transmits data to the selected DIMM.

During a data lane integrity test according to one or more embodiment of the present invention, the data input lines 72 to each driver 54 are driven high to generate a pulse, but the same data input lines 72 are also used by the memory controller later during normal operation for transmitting data to one of the memory modules 20. Similarly, the data output lines 74 from each receiver 56 are provided to an AND gate 78 during the data lane integrity test, but the memory controller also uses the data output line 74 from each receiver 56 to receive data from the memory modules 20.

When the memory controller 30 wants to write data to the memory 20, the memory controller enables the drivers 54 at the memory controller end of each data lane 52, and disables the associated receivers 56 for the complete write cycle. A selected DIMM 20 will have its receivers 66 enabled in order to receive data from the memory controller, while the other unselected DIMMs will have their receivers disabled. When the memory controller 30 wants to read data from the memory 20, the selected DIMM 20 enables its drivers 64 to transmit data from a selected memory address within the DIMM to the enabled receivers 56 of the memory controller.

Figure 4:
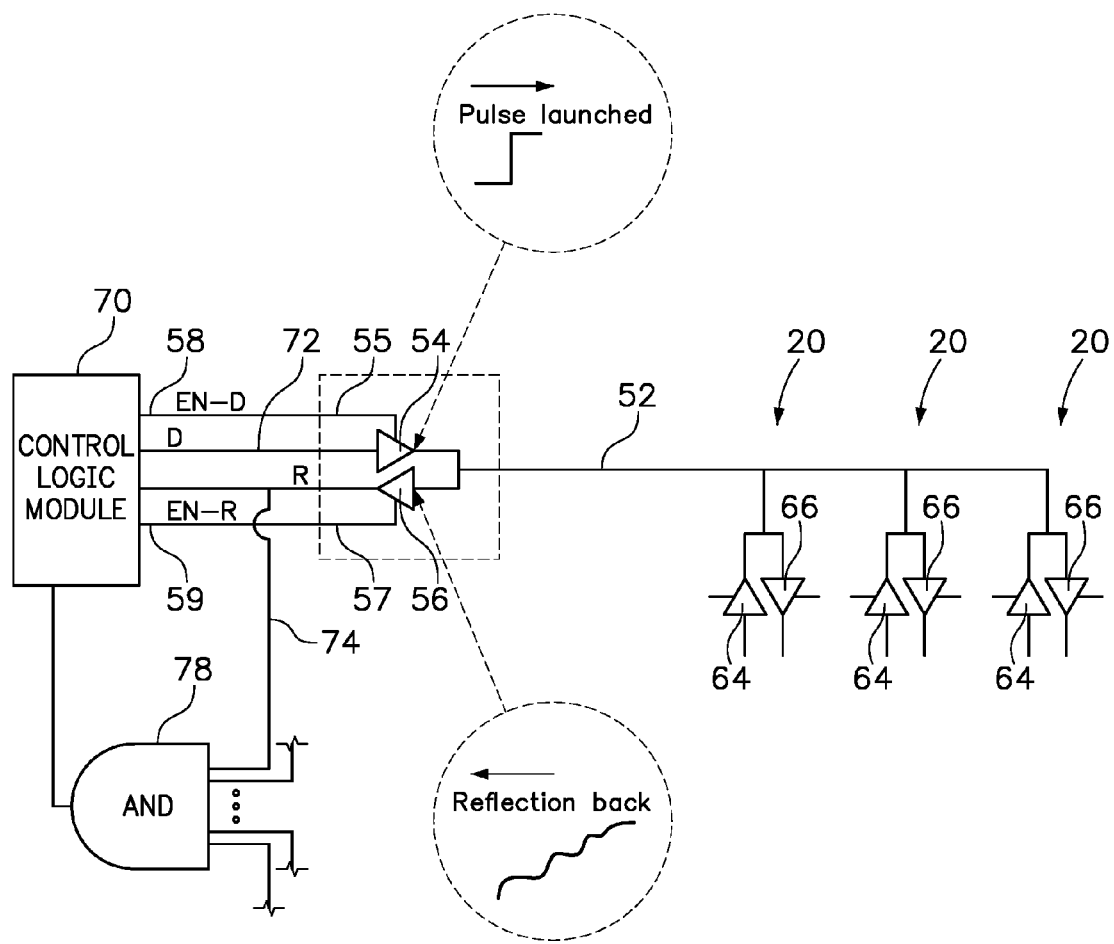
FIG. 4 is a simplified diagram, consistent with FIG. 3, which illustrates a data lane being tested according to another embodiment of the present invention.

FIG. 4 is a simplified diagram, consistent with FIG. 3, which illustrates a data lane 52 being integrity tested according to another embodiment of the present invention. Components already shown in FIG. 3 are given the same reference numbers in the simplified diagram of FIG. 4.

In accordance with embodiments of the present invention, the control logic module 70 initiates a data lane integrity test by driving a high signal (positive) into the input of each driver 54, sending an enable (high) signal over the enable signal line 58 ("EN-D") to the enable input 55 of each driver 54 in order to enable the driver 54, and then sending a disable (low) signal over the enable signal line 58 ("EN-D") to the enable input 55 in order to disable the driver 54. Accordingly, each of the drivers 54 are enabled for only a very short period of time, such as the fastest edge rate that the driver can deliver. For example, the driver may be enabled for a single clock cycle or about 50 picoseconds (ps).

Each receiver 56 is then enabled by sending an enable (high) signal 59 to the enable input signal line 57 of each receiver 56 in order to sample the signal reflected back from the net on each data lane 52. The shape of the reflected signal determines whether or not a receiver 66 is connected at each of the memory modules 20 on the memory interface.

The output of all receivers 56 are coupled to a large AND gate 78. If all data lanes are fully functional and the reflections arrive at the receivers 56 at the same time, then the output of the AND gate 78 will go high (positive) within a certain time window. If any one of the data lanes 52 is defective, then the reflection on the defective data lane will be earlier or later than the reflections on the functional data lanes and the output of the AND gate 78 will be low (negative). This test of data lane integrity may be performed in a matter of microseconds, whereas current data lane tests require many minutes before reaching a determination regarding data lane integrity.

If the data lane integrity across the entire memory interface is confirmed as indicated by a positive output of the AND gate 78, then the DIMM training process may be performed. However, if any of the data lanes 52 of the memory interface is defective as indicated by a negative output of the AND gate 78, then the bad lane may be identified and the DIMM training on the memory interface containing the defective data lane may be stopped. Where a memory system includes multiple memory interfaces (see memory interfaces 36, 38 in FIG. 2), each memory interface may be tested in this manner and the memory controller may proceed to train each data lane of each memory interface that is confirmed to be fully function.

It should be recognized that there are many logic gate arrangements that would produce the logical equivalent of a single AND gate, and use of the term "AND gate" herein is intended to encompass those equivalent logic gate arrangements. Accordingly, the output of the AND gate indicates whether the memory interface is fully functional or includes at least one defective data lane. It should be recognized that the output of the AND gate may indicate that at least one data lane is defective, but will not indicate how many of the data lanes in the memory interface are defective.

Figure 5A:
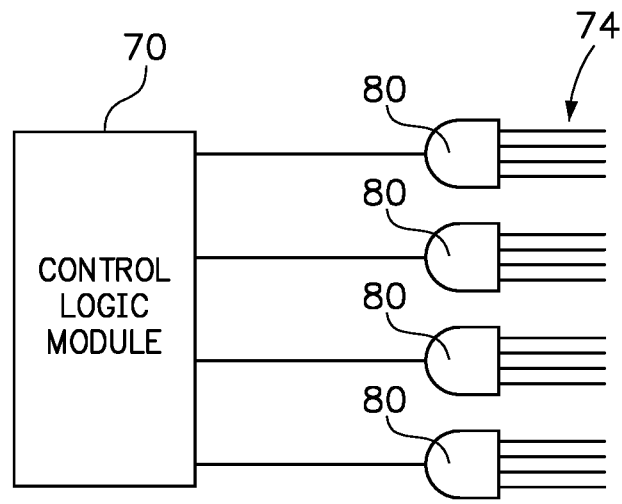
FIGS. 5A and 5B are diagrams of two different logic gate arrangements that are within the scope of the invention.
Figure 5B:
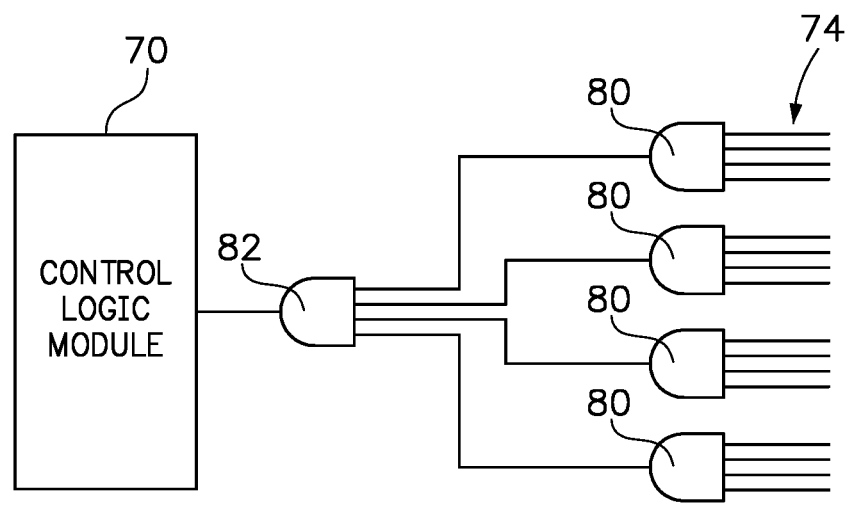

FIGS. 5A and 5B are diagrams of two different logic gate arrangements that are within the scope of the invention. In FIG. 5A, a subset of all input data lanes 74 from the receivers are input to separate AND gates 80, and the output of each of the AND gates 80 is separately input to the control logic module 70. Accordingly, the control logic module 70 can integrity test all of the data lanes and determine whether any one or more of the data lanes in a subset are defective.

In FIG. 5B, the output of each AND gate 80 is input to another AND gate 82. During an integrity test that simultaneously tests each data lane, this group of AND gates 80, 82 is the functional equivalent of a single AND gate (see AND gate 78 in FIGS. 3 and 4), but may provide various configuration or cost advantages.

Figure 6:
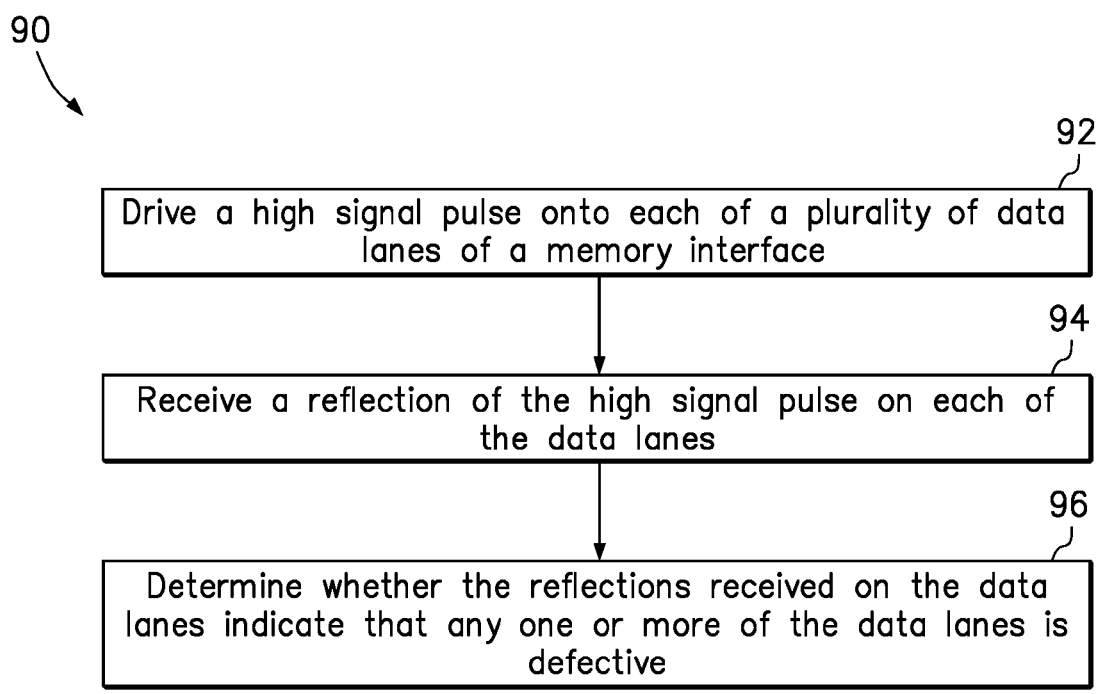
FIG. 6 is a flowchart of a method according to an embodiment of the present invention.

FIG. 6 is a flowchart of a method 90 according to an embodiment of the present invention. In step 92, the method drives a high signal pulse onto each of a plurality of data lanes of a memory interface. In step 94, the method receives a reflection of the high signal pulse on each of the data lanes. Then, in step 96, the method determines whether the reflections received on the data lanes indicate that any one or more of the data lanes is defective.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
driving a high signal pulse onto each of a plurality of data lanes of a memory interface, wherein each of the data lanes is bidirectional, coupled to a respective input of a logical AND gate, and matched in length, and wherein the high signal pulse is simultaneously driven onto each of the plurality of data lanes;
receiving a reflection of the high signal pulse on each of the data lanes; and
determining, by using the AND logic gate, whether the reflections received on the data lanes indicate that any one or more of the data lanes is defective.

2. The method of claim 1, wherein determining whether the reflections received on the data lanes indicate that any one or more of the data lanes is defective, includes determining that none of the data lanes is defective in response to receiving the reflections at the same time.

3. The method of claim 2, wherein each of the data lanes includes a driver and a receiver, and wherein each driver has an output that drives the high signal pulse onto a corresponding data lane and each receiver has an input that receives the reflection of the high signal pulse on the corresponding data lane.

4. The method of claim 3, wherein each input of the logical AND gate receives an output from a respective receiver of a respective data lane, and the logical AND outputs a signal that indicates whether any one or more of the date lanes is defective.

5. The method of claim 3, wherein the driver generates the high signal pulse by applying a high signal to an input of the driver and then enabling and disabling the driver while the high signal is being input to the driver.

6. The method of claim 5, wherein the driver is enabled for a single clock cycle before being disabled.

7. The method of claim 5, further comprising:
after the driver has generated the high signal pulse, enabling the receiver to receive the reflection.

8. The method of claim 1, wherein determining whether the reflections received on the data lanes indicate that any one or more of the data lanes is defective, includes determining that one or more of the data lanes is defective in response to receiving at least one of the reflections at a different time than the other reflections.

9. The method of claim 8, further comprising:
in response to determining that one or more of the data lanes is defective, identifying the one or more of the data lanes that is defective.

10. The method of claim 1, further comprising:
training each of the data lanes in response to determining that none of the data lanes are defective.

11. The method of claim 1, further comprising:
preventing the training of any of the data lanes in response to determining that one or more of the data lanes are defective.

12. A memory system for a computer, comprising:
a memory controller providing a memory interface including a plurality of data lanes, wherein each of the plurality of data lanes includes a driver and a receiver, and wherein each receiver has an output; and
an AND gate having an output and a plurality of inputs, wherein the output of each receiver is coupled to a respective one of the plurality of inputs of the AND gate, and wherein the output of the AND gate provides either a positive signal indicating that none of the data lanes of the memory interface is defective or a negative signal indicating that one or more of the data lanes of the memory interface is defective.

13. The memory system of claim 12, further comprising:
a plurality of memory modules, wherein each memory module is coupled to the plurality of data lanes.

14. The memory system of claim 12, wherein the memory controller provides a second memory interface including a second plurality of data lanes, and wherein each of the second plurality of data lanes includes a driver and a receiver, the memory system further comprising:
a second AND gate having an output and a plurality of inputs, wherein the output of each receiver in the second plurality of data lanes is coupled to one of the plurality of inputs of the second AND gate.

15. The memory system of claim 14, wherein the output of the second AND gate provides either a positive signal indicating that none of the data lanes of the second memory interface is defective or a negative signal indicating that one or more of the data lanes of the second memory interface is defective.

16. The memory system of claim 12, wherein each driver of the memory interface has an enable input coupled to a single driver enable signal line of the memory interface, and wherein each receiver of the memory interface has an enable input coupled to a single receiver enable signal line of the memory interface.

17. The memory system of claim 12, wherein each of the data lanes are bidirectional and matched in length.

18. The memory system of claim 17, wherein the high signal pulse is simultaneously driven onto each of the plurality of data lanes.

* * * * *